(12) United States Patent
Nah et al.

(10) Patent No.: US 9,535,094 B2
(45) Date of Patent: Jan. 3, 2017

(54) VERTICAL/HORIZONTAL PROBE SYSTEM AND CALIBRATION KIT FOR THE PROBE SYSTEM

(71) Applicant: Research & Business Foundation SUNGKYUNKWAN UNIVERSITY, Suwon-si (KR)

(72) Inventors: Wansoo Nah, Seongnam-si (KR); Tae Ho Kim, Seoul (KR); Jong Hyeon Kim, Andong-si (KR)

(73) Assignee: Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/514,926

(22) Filed: Oct. 15, 2014

(65) Prior Publication Data

US 2015/0168446 A1 Jun. 18, 2015

(30) Foreign Application Priority Data

Oct. 17, 2013 (KR) ........................ 10-2013-0123855
Jun. 24, 2014 (KR) ........................ 10-2014-0077534

(51) Int. Cl.
*G01R 31/26* (2014.01)
*G01R 1/073* (2006.01)
(Continued)

(52) U.S. Cl.
CPC ........... *G01R 1/07342* (2013.01); *G01R 27/06* (2013.01); *G01R 35/005* (2013.01); *G01R 1/06772* (2013.01)

(58) Field of Classification Search
CPC ........... G01R 31/2886; G01R 31/2887; G01R 31/31905; G01R 31/002; G01R 1/0491; G01R 1/06705; G01R 1/07392; G01R 1/07364
See application file for complete search history.

(56) References Cited

U.S. PATENT DOCUMENTS 5,313,367 A * 5/1994 Ishiyama .......... H01L 23/49572
228/180.22
6,417,682 B1 * 7/2002 Suzuki .................. G01R 35/00
324/537

(Continued)

FOREIGN PATENT DOCUMENTS

KR 10-2003-0004474 A 1/2003
KR 10-2011-0104392 A 9/2011
KR 10-2012-0096260 A 8/2012

*Primary Examiner* — Tung X Nguyen
*Assistant Examiner* — Dominic Hawkins
(74) *Attorney, Agent, or Firm* — NSIP Law

(57) ABSTRACT

Disclosed is a probe system. The probe system includes a support member configured to grasp a circuit board to be tested vertically to a base plate, a probe-tip member having a probes that are in contact with a conductive pattern of the circuit board, a guide-arm member coupled with the probe-tip member and configured to move the probe-tip member to a desired position, and a network analyzer electrically connected with the probe of the probe-tip member and configured to analyze electromagnetic characteristics of the conductive pattern. Further disclosed is a calibration kit which that is applicable when calibrating a multi-port of the network analyzer using the probe system that is disclosed.

7 Claims, 18 Drawing Sheets

(51) Int. Cl.
  *G01R 35/00* (2006.01)
  *G01R 27/06* (2006.01)
  *G01R 1/067* (2006.01)

(56) References Cited

U.S. PATENT DOCUMENTS

| | | | | |
|---|---|---|---|---|
| 7,414,390 B2* | 8/2008 | Watanabe | ............ | G01R 35/005 |
| | | | | 324/754.03 |
| 2006/0220663 A1* | 10/2006 | Oikawa | .............. | G01R 31/2896 |
| | | | | 324/718 |
| 2007/0040561 A1* | 2/2007 | Kamitani | ............. | G01R 35/005 |
| | | | | 324/601 |
| 2013/0199827 A1* | 8/2013 | Igarashi | ............... | H05K 1/0265 |
| | | | | 174/255 |

* cited by examiner

Port 1-GS Probe        Port 2-GS Probe

Port 3-GS Probe        Port 4-GS Probe

VERTICAL/HORIZONTAL PROBE SYSTEM AND CALIBRATION KIT FOR THE PROBE SYSTEM

CROSS-REFERENCE TO RELATED APPLICATIONS

This application claims the benefit under 35 USC 119(a) of Korean Patent Application No. 10-2013-0123855, filed on Oct. 17, 2013 and Korean Patent Application No. 10-2014-0077534, filed on Jun. 24, 2014, in the Korean Intellectual Property Office, the entire disclosure of which is incorporated herein by reference for all purposes.

BACKGROUND

1. Field

The following description relates to a probe system and a calibration kit for the probe system. The following description also relates to a probe system that inspects a circuit board having a through electrode and measures a coupling effect, and a calibration kit for the probe system.

2. Description of Related Art

The current goals in developing various digital systems may be divided into two major kinds of goal, generally a high speed and a small size. To provide a product in response to customers' needs for high speed, an operation frequency and a signal processing frequency may gradually become faster. Further, in the case of a dual core or a multi-core configuration, in which two or more processors are used, use thereof in various electronic devices which are becoming miniaturized is increasing. However, the various processors and designs just discussed may generate more and more electromagnetic compatibility (EMC) problems in the products. As the electronic devices are miniaturized, various vertical connector pins such as a via-hole and a pogo pin are used.

In particular, the via-hole connector serves as a connector between layers of a multilayered printed circuit board (PCB), and the pogo pin is used in a package test.

If the use of vertical connector pins is increased in digital systems which gradually become faster and smaller, a density of the vertical connector pins is also increased. Thus, there is a problem in that malfunctioning or other operational issues occur due to generation of a coupling effect between the pins.

Further, in the case of a calibration kit for measuring calibration of a 4-port system using an existing ground signal/signal ground (GS/SG) probe, positions of the GS probe and the SG probe are different from each other. Thus, a calibration kit for GS/GS and a calibration kit for SG/SG are separately required in this scenario.

Likewise, since the existing calibration kit is formed in accordance with a horizontal type, when the calibration kit has to be changed into a vertical type in order to measure coupling properties, various issues may occur. For example, these issues may include a change of an arm, a requirement of an additional apparatus, a damage risk of the probe due to re-coupling of the probe, and a decrease of accuracy due to a position change of the probe.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present examples are directed to a probe system which measures transfer characteristics and coupling characteristics of a circuit board including a vertical connector pin such as a through electrode, and performs a horizontal test and a vertical test of the circuit board.

The present examples are also directed to a calibration kit in which multi-port calibration of a network analyzer of the probe system is easily performed in a vertical state within a short period of time.

In one general aspect, a probe system includes a support member disposed on a base plate and configured to grasp a circuit board to be tested vertically to the base plate, a robe-tip member having probes that are in contact with a conductive pattern formed at the circuit board, a guide-arm member coupled to the probe-tip member, configured to move the probe-tip member in a first horizontal direction parallel with an upper surface of the base plate and a second horizontal direction vertical to the first horizontal direction, and to rotate the probe-tip member about an axis parallel to the first horizontal direction, and a network analyzer electrically connected with the probes of the probe-tip member and configured to analyze electromagnetic characteristics of the conductive pattern.

The guide-arm member may include a first horizontal motion part coupled to the base plate configured to reciprocate on the upper surface of the base plate in the first horizontal direction, a second horizontal motion part coupled to the first horizontal motion part configured to reciprocate on the first horizontal motion part in the second horizontal direction, a rotational motion part coupled to a side surface of the second horizontal motion part, which is directed to the circuit board, and configured to be rotatable about an axis parallel with the first horizontal direction; and a guide part coupled to the rotational motion part and the probe-tip member.

The rotational motion part may have a circular disc shape having a first flat surface coupled to the second horizontal motion part, a second flat surface parallel to the first flat surface, and a curved surface configured to connect the first flat surface and the second flat surface.

The probes of the probe-tip member may include a first probe to which a test signal is applied, and two second probes that are spaced apart from each other in a state in which the first probe is interposed between the two second probes and to which a ground signal is applied.

The probes of the probe-tip member may include a first probe to which a test signal is applied, and a second probe that is disposed to be adjacent to the first probe and to which a ground signal is applied.

The support member may include a lower plate coupled to the upper surface of the base plate, an upper plate disposed above the lower plate, a height adjusting device disposed between the lower plate and the upper plate and configured to adjust a distance between the lower plate and the upper plate, and a substrate grasping device removably coupled to an upper portion of the upper plate and configured to grasp the circuit board vertically to the base plate.

The substrate grasping device may include a support plate removably coupled to an upper portion of the upper plate, and a grasping part disposed on an upper surface of the support plate and configured to press both surfaces of the circuit board that is vertically disposed.

The grasping part may include a first grasping part disposed to be adjacent to a first surface of the circuit board and coupled to the support plate to reciprocate in a direction vertical to the first surface, and a second grasping part disposed to be adjacent to a second surface of the circuit board opposite to the first surface and coupled to the support plate to reciprocate in a direction vertical to the second surface.

In another general aspect, a calibration kit that is applied to a calibration of a probe system includes a substrate and a through pattern, wherein the through pattern includes a first conductive pattern formed at a first surface of the substrate and having a first signal pattern and one or more first ground patterns spaced from the first signal pattern, a second conductive pattern formed at a second surface of the substrate opposite to the first surface and having a second signal pattern having a mirror-image symmetric structure together with the first signal pattern and one or more second ground patterns having a mirror-image symmetric structure together with the first ground patterns, and a through electrode having a first through electrode configured to pass through the substrate and to electrically connect the first signal pattern with the second signal pattern and one or more second through electrodes configured to pass through the substrate and to electrically connect the first ground patterns with the corresponding second ground patterns.

The first ground patterns may be spaced from each other in a state in which the first signal pattern is interposed between the first ground patterns and the first ground patterns include two ground patterns insulated from each other, and the second ground patterns are spaced from each other in a state in which the second signal pattern is interposed between the second ground patterns and the second ground patterns include two ground patterns insulated from each other, and the second through electrode includes a through electrode configured to electrically connect one of the first ground patterns with one of the second ground patterns, which overlaps with the one of the first ground patterns, and a through electrode configured to electrically connect the other one of the first ground patterns with the other one of the second ground patterns, which overlaps with the other one of the first ground patterns.

The first signal pattern may include a first through electrode connection part connected to one end of the first through electrode, and two first probe connection parts disposed to be symmetrical with respect to the first through electrode connection part, connected to both sides of the first through electrode connection part, and configured to extend in a first direction, and the two ground patterns of the first ground pattern are spaced from each other in a second direction vertical to the first direction, and a length of the first signal pattern in the first direction is the same as that of the first ground pattern in the first direction.

The first ground pattern and the second ground pattern may have a first opening and a second opening formed at center portions thereof, respectively, and the first signal pattern and the second signal pattern may be disposed in the first opening and the second opening, respectively.

An outline of the first opening and an outline of the first signal pattern may be spaced a predetermined distance from each other.

Each of the first signal pattern and the second signal pattern may include a through electrode connection part connected with the first through electrode, and two first probe connection parts disposed to be symmetrical with respect to the through electrode connection part, connected with both sides of the through electrode connection part, and configured to extend in the same direction.

The second through electrode may include two electrodes configured to electrically connect the first ground pattern with the second ground pattern, and the first through electrode and the two second through electrodes may be arranged in a row.

Other features and aspects will be apparent from the following detailed description, the drawings, and the claims.

Figure 1:
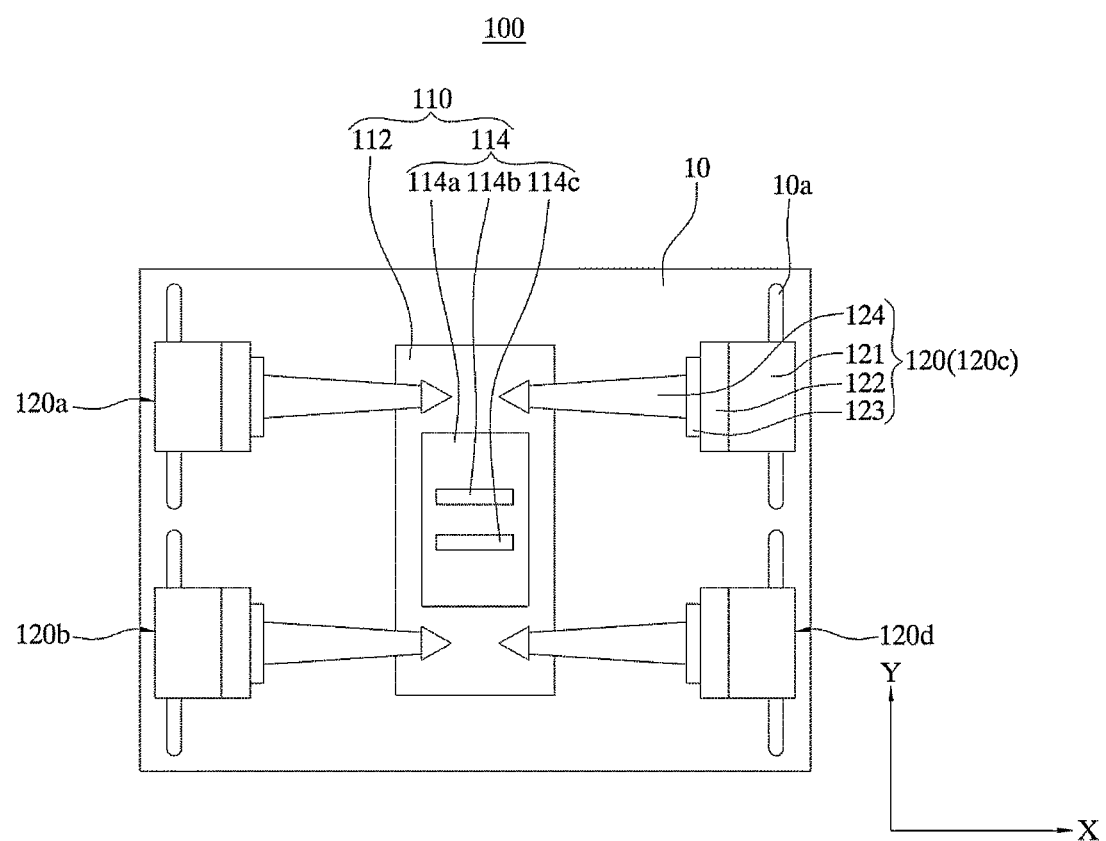
FIG. 1 is a plan view illustrating a probe system according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, the examples will be described in detail with reference to the accompanying drawings. However, the present invention is not limited to the examples, and it should be understood that the present invention comprises all of equivalents and substitutes included in the technical scope and spirit of the invention. In describing the drawings, the same reference numerals are given to the same or corresponding parts, and it is to be understood that accompanying drawings may be enlarged or reduced for the convenience of explanation.

The terms used herein are merely to describe a specific example, and thus the present invention is not limited to them. Further, unless a singular expression clearly denotes a different meaning in context, it includes a plural expression as well. It is understood that terms "comprises," "comprising," "includes," or "has" are intended to indicate the existence of features, numerals, steps, operations, elements, and components described in the specification or the existence of the combination of these, and do not exclude the existence of one or more other features, numerals, steps, operations, elements, and components or the existence of the combination of these or additional possibility beforehand.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and are not intended to be interpreted in an idealized or overly formal sense unless expressly so defined here.

In the present examples, a "horizontal test" refers to performing a test of a circuit board horizontally disposed with respect to a base plate using a probe system, and a "vertical test" refers to performing the test of the circuit board vertically disposed with respect to the base plate using the probe system.

The probe system is now discussed further.

Figure 2:
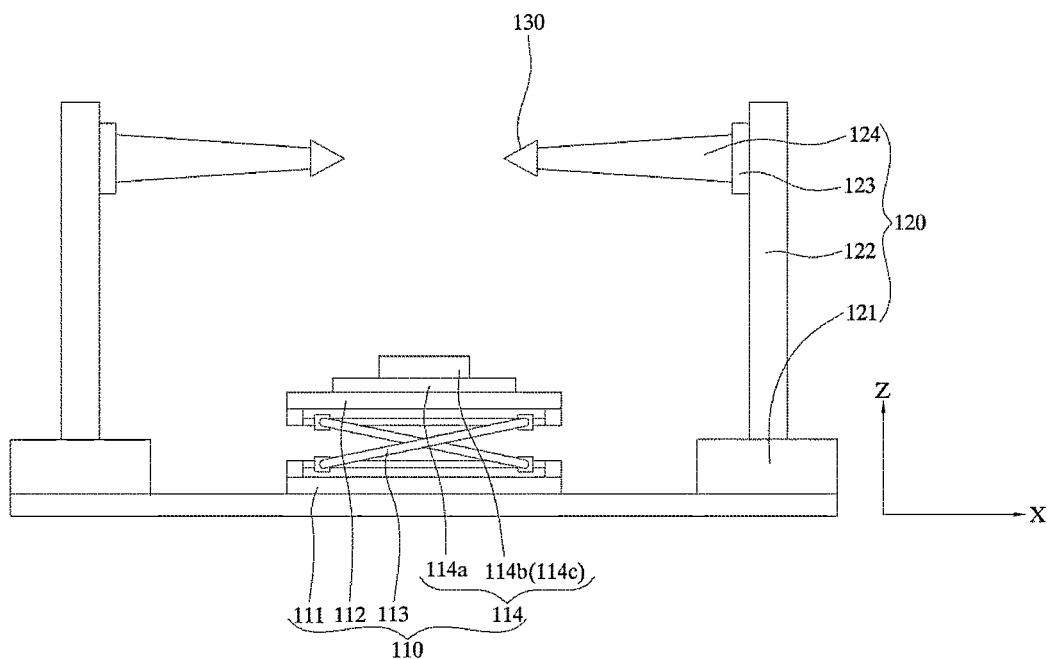
FIG. 2 is a side view of the probe system of FIG. 1.

FIG. 1 is a plan view illustrating a probe system according to an example, and FIG. 2 is a side view of the probe system of FIG. 1.

Referring to FIGS. 1 and 2, the probe system 100 according to the example easily measures electromagnetic characteristics, such as a signal transfer characteristic and a coupling effect, of, for example, a vertical connector pin such as a through electrode formed at a via-hole of a circuit board as well as a horizontal connector pin formed at only one surface of the circuit board. The probe system 100 includes a support member 110, one or more guide-arm members 120, one or more probe-tip members 130, and a network analyzer (not shown).

The support member 110 is disposed on an upper surface of a base plate 10 to support a circuit board (not shown) to be tested. In one example, the support member 110 includes a lower plate 111, an upper plate 112, a height adjusting device 113, and a substrate grasping device 114.

The lower plate 111 is fixed on the upper surface of the base plate 10. The lower plate 111 is disposed so as to be parallel with the base plate 10. The upper plate 112 is disposed above the lower plate 111 so as to be parallel with the lower plate 111. In an example, the lower plate 111 and the upper plate 112 respectively have a quadrangular plate shape.

The height adjusting device 113 is disposed between the lower plate 111 and the upper plate 112 to adjust a distance between the lower plate 111 and the upper plate 112, where the distance is a height from the base plate 10 to the upper plate 112. The substrate grasping device 114 is disposed on the upper plate 112 and is removably coupled to the upper plate 112.

The substrate grasping device 114 grasps the circuit board to be tested so that the circuit board is vertically disposed with respect to the upper surface of the base plate 10. In an example, the substrate grasping device 114 includes a support plate 114a disposed on the upper plate 112, and first and second grasping parts 114b and 114c disposed on the support plate 114a. The support plate 114a is detachably coupled onto the upper plate 112. In such an example, the first grasping part 114b and the second grasping part 114c are disposed to be opposite to each other in a state in which the circuit board is interposed therebetween, and also may be disposed on the support plate 114a to reciprocate in a first horizontal direction Y parallel with an upper surface of the support plate 114a. In an example, the first and second grasping parts 114b and 114c respectively have a rectangular parallelepiped structure extending in a second horizontal direction X vertical to the first horizontal direction The guide-arm member 120 is disposed on the upper surface of the base plate 10, and coupled with the probe-tip member 130 to move the probe-tip member 130 to a desired position. In one example, as illustrated in FIGS. 1 and 2, the probe system 100 includes four guide-arm members 120 and four probe-tip members 130 coupled to the four guide-arm members 120. In this example, the four guide-arm members 120 are disposed to be symmetric with respect to the support member 110.

Figure 3:
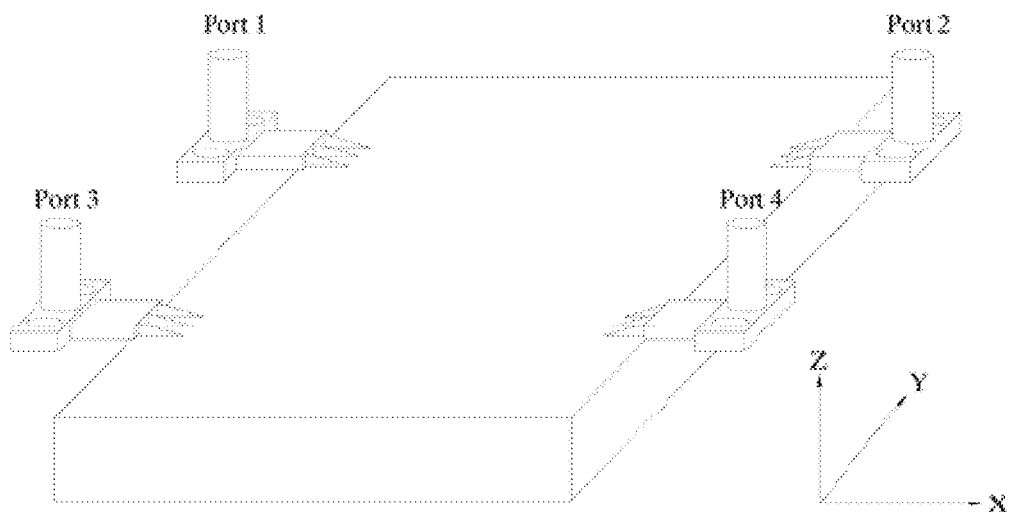
FIG. 3 is a view illustrating a horizontal test method of a circuit board using the probe system according to an example.
Figure 4:
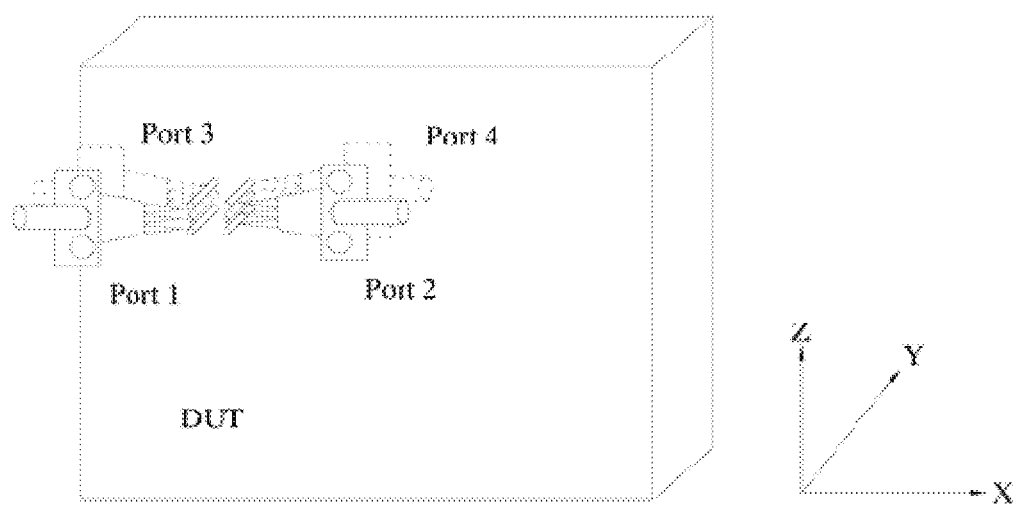
FIG. 4 is a view illustrating a vertical test method of a circuit board using the probe system of FIG. 3.

As an example, as illustrated in FIGS. 3 and 4, two 120a and 120b of the four guide-arm members 120a, 120b, 120c, and 120d are disposed at one side of the support member 110, and the other two guide-arm members 120c and 120d are disposed at the other side of the support member 110. For example, in the example that the base plate 10 has a quadrangular plate structure and the support member 110 is disposed at a center portion of the base plate 10, the two 120a and 120b of the four guide-arm members 120a, 120b, 120c, and 120d are disposed at a position adjacent to a first side of the base plate 10, which is parallel with the first horizontal direction Y, spaced apart from each other, and the other two guide-arm members 120c and 120d are disposed at positions adjacent to a second side of the base plate 10 opposite to the first side, spaced apart from each other. In this example, the two guide-arm members 120a and 120b are disposed to be adjacent to the first side of the base plate 10 and to individually reciprocate in the first horizontal direction Y. The two guide-arm members 120c and 120d are disposed to be adjacent to the second side of the base plate 10 and also individually reciprocate in the first horizontal direction Y.

Figure 5:
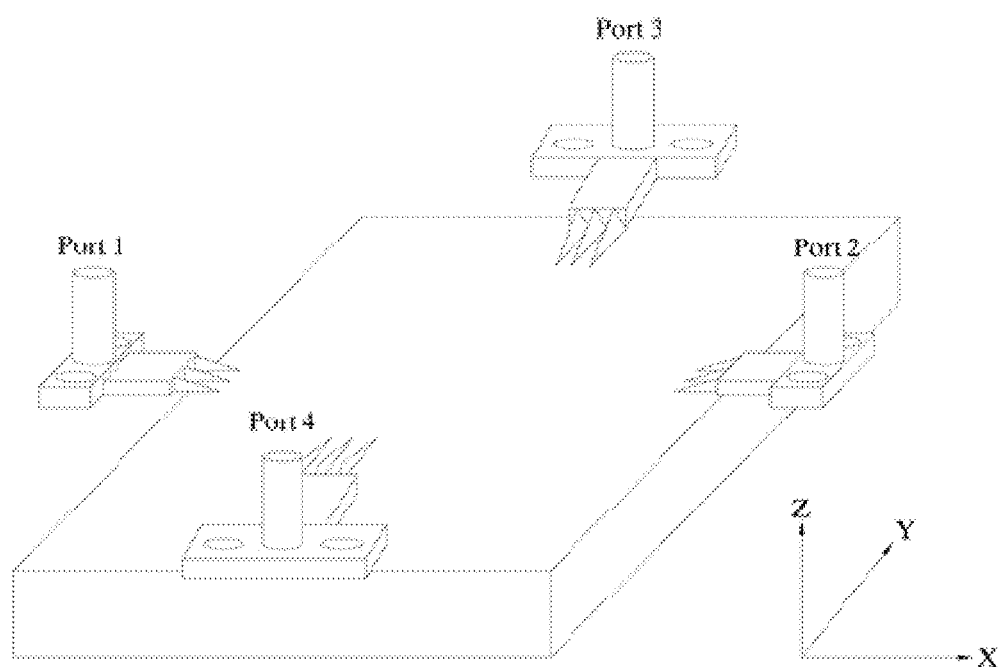
FIG. 5 is a view illustrating a horizontal test method of the circuit board using the probe system according to another example.
Figure 6:
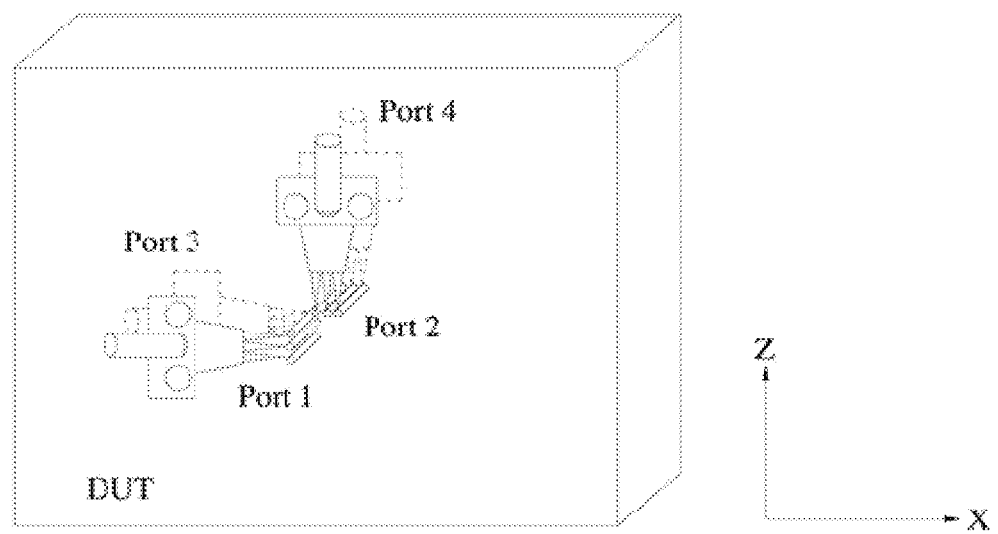
FIG. 6 is a view illustrating a vertical test method of the circuit board using the probe system of FIG. 5.

As another example, as illustrated in FIGS. 5 and 6, two of the four guide-arm members are disposed to be spaced apart from each other in the first horizontal direction Y, while the support member 110 is interposed between these guide-arm members. The other two of the four guide-arm members are disposed to be spaced apart from each other in the second horizontal direction X, while the support member 110 is interposed therebetween. For example, in the example that the base plate 10 has the quadrangular plate structure and the support member 110 is disposed at a center portion of the base plate 10, the four guide-arm members, to which port 1, port 2, port 3, and port 4 are respectively coupled, are disposed to be adjacent to each of four sides of the base plate 10. For example, the two guide-arm members, to which port 3 and port 4 are respectively coupled, are spaced apart from each other in the first horizontal direction Y and individually reciprocate in the second horizontal direction X, and the two guide-arm members, to which port 1 and port 2 are respectively coupled, are spaced apart from each other in the second horizontal direction X and individually reciprocate in the first horizontal direction Y.

Hereinafter, a configuration of the guide-arm member 120 is described further. Since each of the guide-arm members 120 has the same or a similar configuration, only one guide-arm member is described. Accordingly, descriptions of the rest of the guide-arm members are omitted.

In one example, as illustrated in FIGS. 1 and 2, the guide-arm member 120 includes a first horizontal motion part 121, a second horizontal motion part 122, a rotational motion part 123, and a guide part 124.

The first horizontal motion part 121 is coupled to the base plate 10 to reciprocate on the upper surface of the base plate 10 in a certain horizontal direction parallel with the base plate 10. In an example, the certain horizontal direction is the first horizontal direction Y. As an example, the base plate 10 includes a first opening 10a which is cut away along in the first horizontal direction Y, and a first protruding portion (not shown) that is inserted into the first opening 10a and moved along the first opening 10a that is formed at a lower surface of the first horizontal motion part 121.

The second horizontal motion part 122 is coupled to the first horizontal motion part 121 to reciprocate on the first horizontal motion part 121 in a direction vertical to the first horizontal direction Y, for example, in the second horizontal direction X. As an example, a second opening (not shown) is formed at an upper surface of the first horizontal motion part 121 to extend along in the second horizontal direction X, and a second protruding portion (not shown) that is inserted into the second opening and that is moved along the second opening is formed at a lower surface of the second horizontal motion part 122.

In an example, the rotational motion part 123 is rotatably coupled to a side surface of the second horizontal motion part 122 that is directed towards the support member 110. As an example, the rotational motion part 123 has a circular disc shape, and is coupled to the second horizontal motion part 122 to be rotated about a center axis of the circular disc.

In this example, the guide part 124 is coupled to the rotational motion part 123. The guide part 124 has a structure that extends to an upper surface of the support member 110. The guide part 124 is relatively rotated, with respect to the second horizontal motion part 122, by rotation of the rotational motion part 123.

In the example of FIG. 2, a probe-tip member 130 is coupled to a free end of the guide part 124. In such an example, the probe-tip member 130 is electrically connected to the network analyzer through a cable (not shown) and also has a probe which is in contact with a conductive pattern formed on the circuit board to be tested. For example, the probe-tip member 130 includes a first probe to which a test signal is applied, and one or more second probes to which a ground signal is applied. As an example, as illustrated in FIGS. 3 to 6, the probe-tip member 130 includes a first probe and two second probes which are spaced apart from each other in a state in which the first probe is interposed between the two second probes. As another example, as illustrated in FIGS. 9A to 9C and 10A to 10C, the probe-tip member 130 includes one first probe and one second probe disposed to be adjacent to the first probe. Additionally, appropriate devices are used as the probe-tip member 130 in examples without any limitations.

In an example, the network analyzer (not shown) analyzes the electromagnetic characteristics of the conductive pattern formed on the circuit board to be tested by using the probe of the probe-tip member 130. Appropriate devices may be used as the network analyzer without any limitation.

The probe system 100 according to the examples easily measures the electromagnetic characteristics of the vertical connector pin such as the through electrode formed at the via-hole of the circuit board. Specifically, to measure the electromagnetic characteristics of the vertical connector pin, the probe of the probe-tip member 130 is simultaneously in contact with both ends of the through electrode formed at the circuit board. In the present examples, the circuit board is grasped vertically along the upper surface of the base plate 10 using the substrate grasping device 114 of the support member 110, and directions and positions of the probes are easily controlled using the first and second horizontal motion parts 121 and 122, the rotational motion part 123, and the guide part 124 of the guide-arm member 120. As a result, the probes of the probe-tip member 130 coupled to the two guide-arm members 120 are simultaneously placed in contact with the both ends of the through electrode formed on the circuit board grasped vertically. Therefore, as a result, the probes are well-adapted to measure the electromagnetic characteristic of the vertical connector pin because they achieve the goal of simultaneous contact with both ends of the through electrode.

Hereinafter, a method of testing the circuit board using the probe system 100 according to one example is described with reference to FIGS. 3 and 4.

FIG. 3 is a view illustrating a horizontal test method of the circuit board using the probe system according to one example, and FIG. 4 is a view illustrating a vertical test method of the circuit board using the probe system of FIG. 3.

The probe system 100 illustrated in FIGS. 3 and 4 includes the two guide-arm members 120a and 120b disposed at one side of the support member 110, and the two guide-arm members 120c and 120d disposed at the other side of the support member 110 opposite to the one side thereof where the other two guide-arm members 120a and 120b are disposed.

Firstly, referring to FIG. 3, the four probe-tip members (port 1, port 2, port 3, and port 4) are individually moved in the first horizontal direction Y and the second horizontal direction X vertical to the first horizontal direction Y by the first horizontal motion part 121 and the second horizontal motion part 122 of each of the four guide-arm members 120 which are respectively coupled to the probe-tip members. Thus, in the example of FIG. 3, the four probe-tip members are in contact with the conductive pattern formed on one surface of the circuit board disposed to be parallel with the base plate 10, and the "horizontal test" of the printed circuit board is performed by the four probe-tip members.

Then, referring to FIG. 4, the circuit board is grasped vertically to the base plate 10 using the substrate grasping device 114 of the support member 110. Each of the four probe-tip members 130 is rotated at about 90° toward the circuit board using the rotational motion part 123 of each of the four guide-arm members 120. Thus the "vertical test" of the through electrode passing through the circuit board is performed using the same probe system 100 as that used for the "horizontal test" without using a separate subsidiary device for each test.

Hereinafter, a method of testing the circuit board using the probe system 100 according to another example is described with reference to FIGS. 5 and 6.

FIG. 5 is a view illustrating the horizontal test method of the circuit board using the probe system according to another example, and FIG. 6 is a view illustrating the vertical test method of the circuit board using the probe system of FIG. 5.

The probe system 100 illustrated in FIGS. 5 and 6 includes the four guide-arm members 120 respectively disposed in four directions of the support member 110.

Referring to the example FIGS. 5 and 6, the probe system 100 also performs the "horizontal test" and "vertical test" of the circuit board in a similar manner to the probe system 100 of FIGS. 3 and 4. FIG. 6 also illustrates the device under test (DUT).

The calibration kit for probe system is now discussed further.

Generally, in the probe system including the network analyzer, as discussed, a calibration is performed before an actual test of the circuit board is performed. The calibration kits according to the examples are used in the calibration of the network analyzer. The calibration of the probe system generally includes an open calibration, a short calibration, a load calibration, and a thru calibration.

Figure 7A:
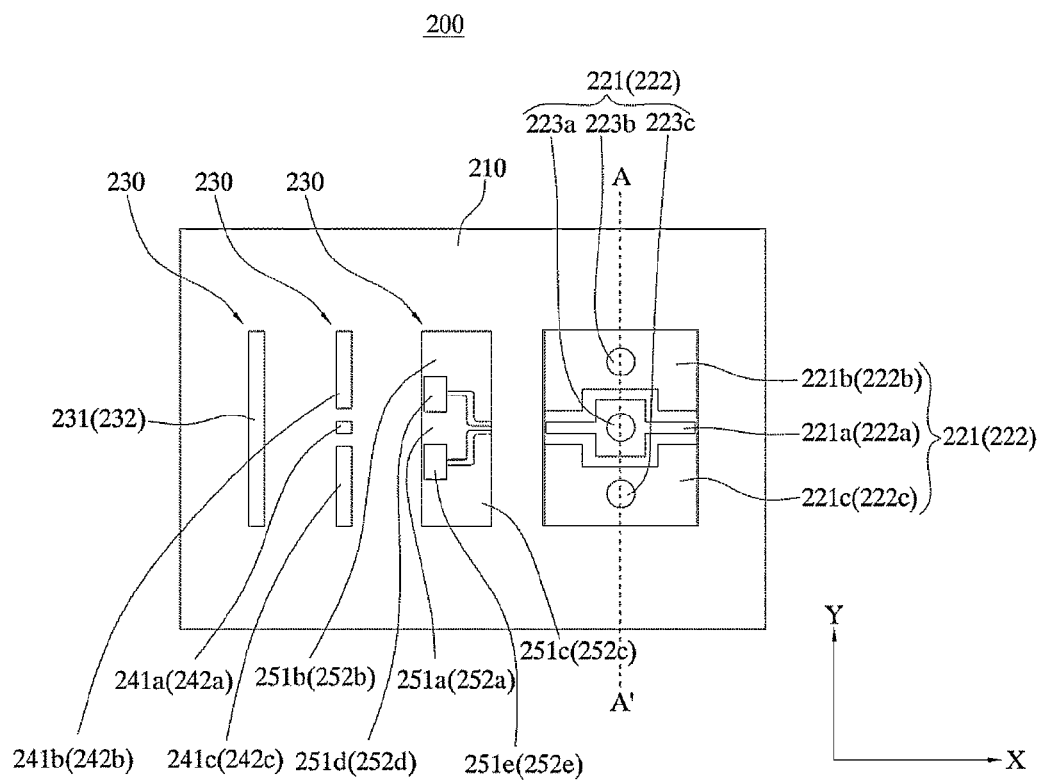
FIG. 7A is a plan view illustrating a calibration kit according to an example.
Figure 7B:
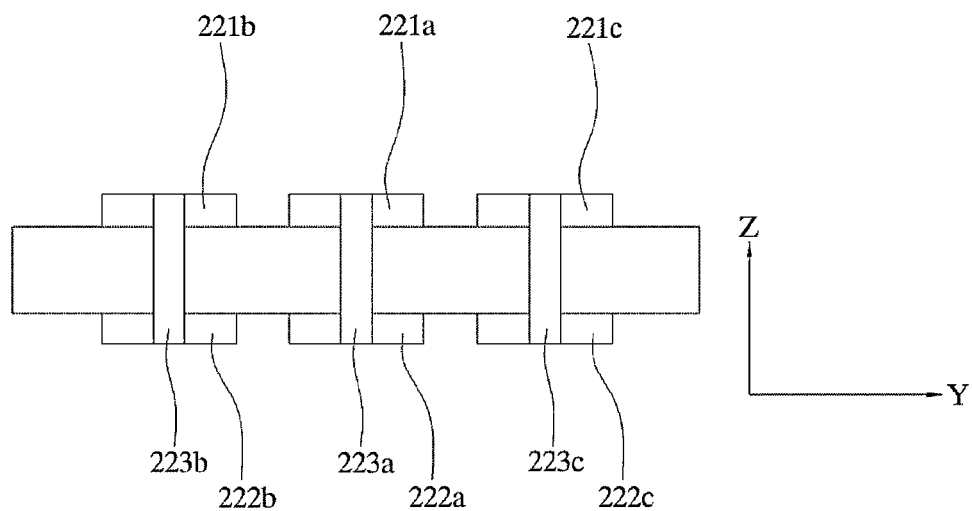
FIG. 7B is a cross-sectional view taken along line A-A' of FIG. 7A.

FIG. 7A is a plan view illustrating a calibration kit according to one example, and FIG. 7B is a cross-sectional view taken along line A-A' of FIG. 7A.

The calibration kit 200 according to the example is applied to the calibration of the probe system in which the probe-tip member 130 as presented in FIGS. 1 and 2 has three probes, that is, one first probe to which the test signal is applied, and two second probes which are spaced apart from each other in a state in which the first probe is interposed between the two second probes and to which the ground signal is applied.

Referring to FIGS. 7A and 7B, the calibration kit 200 according to the example includes a substrate 210 and at least one through pattern 220.

Substrates used in appropriate calibration kits are potentially used as the substrate 210 without any limitations. As an example, an insulating plastic substrate is used as the substrate 210.

The through pattern 220 is applied to the thru calibration of the probe system, and includes first conductive patterns 221, second conductive patterns 222, and through electrodes 223.

In the examples of FIGS. 7A and 7B, the first and second conductive patterns 221 and 222 have a mirror-image symmetric structure with respect to the substrate 210. For example, the first conductive patterns 221 are formed on a first surface of the substrate 210, and include one first signal pattern 221 a and two first ground patterns 221b and 221c. In such an example, the second conductive patterns 222 are formed on a second surface of the substrate 210 opposite to the first surface, and include one second signal pattern 222a and two second ground patterns 222b and 222c.

The through electrodes 223 are formed to pass through the substrate 210, and in the example of FIGS. 7A and 7B include a first through electrode 223a configured to electrically connect the first signal pattern 221a with the second signal pattern 222a, two second through electrodes 223b and 223c configured to electrically connect the two first ground patterns 221b and 221c with the two second ground patterns 222b and 222c, respectively.

In one example, the first conductive patterns 221a, 221b, and 221c include one first signal pattern 221a, and two first ground patterns 221b and 221c spaced apart from each other in a state in which the first signal pattern 221a is interposed between the two first ground patterns. As an example, the first signal pattern 221a includes a first through electrode connection part connected with one end of the first through electrode 223a, and two first probe connection parts connected to both sides of the first through electrode connection part to be symmetrical with respect to the first through electrode connection part.

In an example, the first through electrode connection part is formed in a rectangular shape having two sides parallel with the first horizontal direction Y and two sides parallel with the second horizontal direction X vertical to the first horizontal direction Y. In such an example, the first through electrode 223a is connected to a center portion of the first through electrode connection part. Each of the two first probe connection parts extends in a direction parallel with the second horizontal direction X, and also has a predetermined width in the first horizontal direction Y. A width of each of the two first probe connection parts is smaller than that of the first through electrode connection part in the first horizontal direction Y, and is connected with center portions of the two sides of the first through electrode connection part, which are parallel with the first horizontal direction Y.

Meanwhile, in this example, the first signal pattern 221a has a single pattern structure in which the first through electrode connection part and the two first probe connection parts are integrally formed. The two first ground patterns 221b and 221c are spaced apart from each other in the first horizontal direction Y in a state in which the first signal pattern 221a is interposed between the two first ground patterns 221b and 221c, and have a symmetric structure with respect to the first signal pattern 221a. In each of the two first ground patterns 221b and 221c, an outline portion opposite to the first signal pattern 221a is potentially formed to be spaced a predetermined distance from an outline of the first signal pattern 221a, and in an example each length of the first signal pattern 221a and the first ground patterns 221b and 221c in the second horizontal direction X is the same.

In this example, the second conductive patterns 222a, 222b, and 222c include one second signal pattern 222a, and two second ground patterns 222b and 222c spaced apart from each other in a state in which the second signal pattern 222a is interposed between the two second ground patterns 222b and 222c. Since the second signal pattern 222a and the two second ground patterns 222b and 222c, and the first signal pattern 221a and the two first ground patterns 221b and 221c each have a mirror-image symmetric structure with respect to the substrate 210, detailed description thereof is omitted.

The through electrodes 223a, 223b, and 223c include a first through electrode 223a configured to electrically connect a center portion of the first signal pattern 221a with a center portion of the second signal pattern 222a, and two second through electrodes 223b and 223c configured to electrically connect center portions of the two first ground patterns 22 lb and 221c with corresponding center portions of the two second ground patterns 222b and 222c. In this example, the first through electrode 223a is disposed between the two second through electrodes 223b and 223c, and the first through electrode 223a and the two second through electrodes 223b and 223c are disposed in series in the first horizontal direction Y.

For example, the first probe of the probe-tip member 130, to which a signal voltage is applied, is in contact with the first and second signal patterns 221a and 222a, and the second probes of the probe-tip member 130, to which a ground voltage is applied, are in contact with the first and second ground patterns 221b, 221c, 222b, and 222c.

The calibration kit 200 according to the example optionally further includes one or more short patterns 230, one or more open patterns 240, and one or more load patterns 250 which are applied to each of the short calibration, the open calibration, and the load calibration of the probe system. The short patterns 230, the open patterns 240, and the load patterns 250 are formed on one or more of a first surface and a second surface of the substrate 210.

In one example, each of the short patterns 230, the open patterns 240, and the load patterns 250 is formed on the first and second surfaces of the substrate 210, respectively.

For example, the short patterns 230 include a first short pattern 231 formed on the first surface of the substrate 210, and a second short pattern 232 formed on the second surface of the substrate 210. The second short pattern 232 has a mirror-image symmetric structure together with the first short pattern 231, and is formed to be overlapped with the first short pattern 231. In an example, the first and second short patterns 231 and 232 are electrically insulated, and have a rectangular shape extending along the first horizontal direction Y. For example, the first probe of the probe-tip member 130, to which the signal voltage is applied, and the second probes of the probe-tip member 130, to which the ground voltage is applied, are positioned to be simultaneously in contact with the first and second short patterns 231 and 232.

Also in such an example, the open patterns 240 include a first open pattern 241 formed on the first surface of the substrate 210, and a second open pattern 242 formed on the second surface of the substrate 210. The second open pattern 242 has a mirror-image symmetric structure together with the first open pattern 241, and is formed to be overlapped with the first open pattern 241. Therefore, the first open pattern 241 is described, and description of the second open pattern 242 is omitted.

For example, the first open pattern 241 includes one third signal pattern 241a and two third ground patterns 241b and 241c. The third ground patterns 241b and 241c are formed to be spaced apart from each other in the first horizontal direction Y in a state in which the third signal pattern 241a is interposed between the third ground patterns 24 lb and 241c. In an example, the two third ground patterns 241b and 241c have the same shape.

In an example, the load patterns 250 include a first load pattern 251 formed on the first surface of the substrate 210, and a second load pattern 252 formed on the second surface of the substrate 210. The second load pattern 252 has a mirror-image symmetric structure together with the first load pattern 251, and is formed to be overlapped with the first load pattern 251. Therefore, the first load pattern 251 is described, and description of the second load pattern 252 is omitted.

In this example, the first load pattern 251 includes a fourth signal pattern 251a, two fourth ground patterns 251b and 251c, and two resistors 251d and 251e. In such an example, the fourth ground patterns 251b and 251c are formed to be spaced apart from each other in the first horizontal direction Y in a state in which the fourth signal pattern 251a is interposed between the fourth ground patterns 251b and 251c. Also in this example, the resistors 251d and 251e include a first resistor 251d configured to connect one of the fourth signal pattern 251a and the fourth ground patterns 251b and 251c, and a second resistor 251e configured to connect the other one of the fourth signal pattern 251a and the fourth ground patterns 251b and 251c. In such an example, the first and second resistors 251d and 251e potentially have the same shape and structure, and potentially also have the same preset resistance value. The two fourth ground patterns 251b and 251c also potentially have the same shape.

Figure 8A:
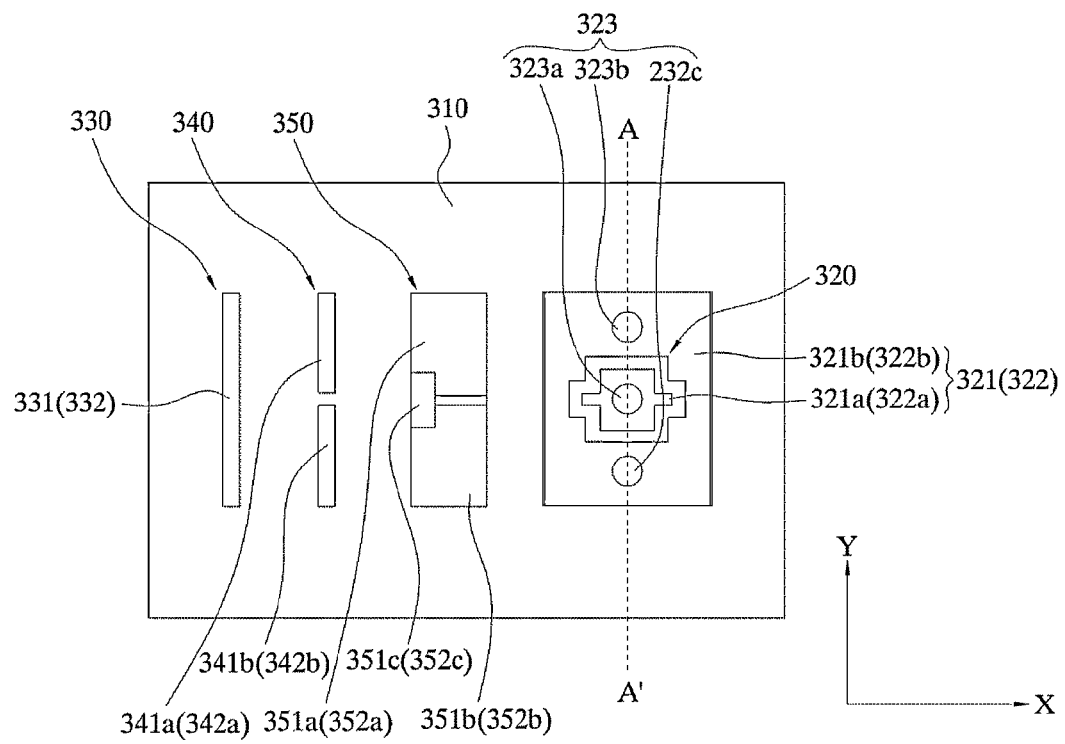
FIG. 8A is a plan view illustrating a calibration kit according to another example.
Figure 8B:
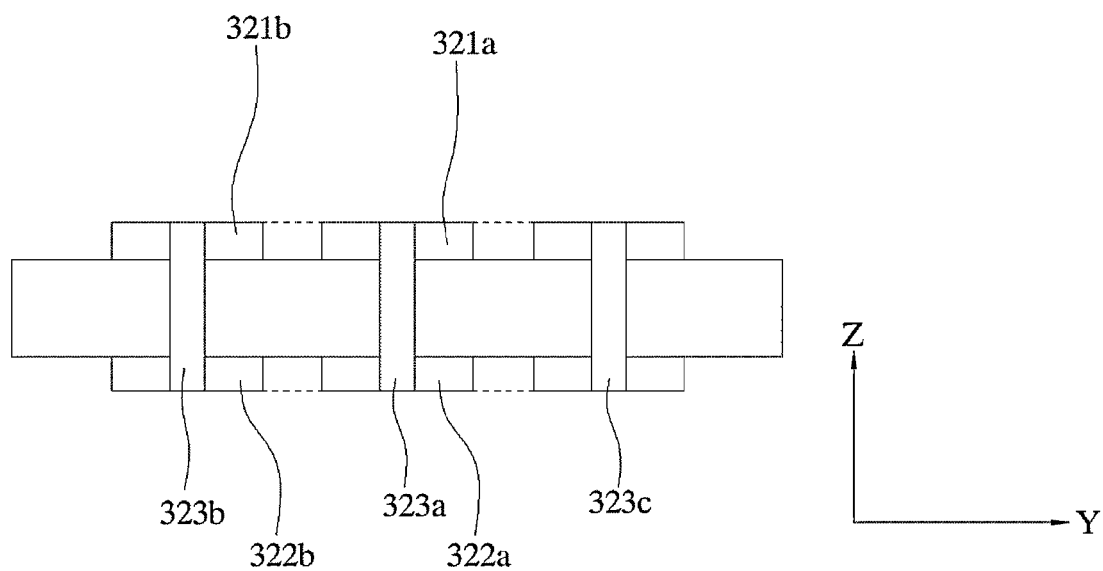
FIG. 8B is a cross-sectional view taken along line A-A' of FIG. 8A.

FIG. 8A is a plan view illustrating a calibration kit according to another example, and FIG. 8B is a cross-sectional view taken along line A-A' of FIG. 8A.

The calibration kit 300 according to the example is applied to the calibration of the probe system in which the probe-tip member 130 as shown in FIGS. 1 and 2 has two probes, that is, one first probe to which the test signal is applied, and one second probe that is disposed to be adjacent to the first probe and to which the ground signal is applied.

Referring to FIGS. 8A and 8B, the calibration kit 300 according to the embodiment of the present invention includes a substrate 310 and one or more through patterns 320.

In an example, the through patterns 320 are applied to the thru calibration of the probe system, and the through patterns 320 include first conductive patterns 321, second conductive patterns 322, and through electrodes 323. In the example of FIGS. 8A and 8B, the first conductive patterns 321 are formed on the first surface of the substrate 310, and include a first signal pattern 321a and a first ground pattern 321b that are insulated from each other. The second conductive patterns 322 is be formed on the second surface of the substrate 310 opposite to the first surface, and includes a second signal pattern 322a and a second ground pattern 322b which are insulated from each other. In this example, the first conductive patterns 321 and the second conductive patterns 322 have a mirror-image symmetric structure.

In this example, the through electrodes 323 include a first through electrode 323a configured to electrically connect the first signal pattern 321a with the second signal pattern 322a, and one or more second through electrodes 323b and 323c configured to electrically connect the first ground pattern 321b with the second ground pattern 322b.

In one example, the first signal pattern 321a includes a first through electrode connection part connected with one end of the first through electrode 323a, and two first probe connection parts connected to both sides of the first through electrode connection part so as to be symmetrical with respect to the first through electrode connection part. In an example, the first through electrode connection part is formed in a rectangular shape having two sides that are parallel with the first horizontal direction Y and two sides that are parallel with the second horizontal direction X vertical to the first horizontal direction Y. Additionally, in this example, the first through electrode 323a is connected to a center portion of the first through electrode connection part.

Also, in this example, each of the two first probe connection parts extends in a direction parallel with the second horizontal direction X, and also has a predetermined width in the first horizontal direction Y. A width of each of the two first probe connection parts is smaller than a length of the side of the first through electrode connection part, which is parallel with the first horizontal direction Y. The two first probe connection parts are respectively connected with center portions of two of the sides of the first through electrode connection part, which are parallel with the first horizontal direction Y. The first signal pattern 321a has a single pattern structure in which the first through electrode connection part and the two first probe connection parts are integrally formed.

In the example of FIGS. 8A and 8B, the first ground pattern 321b has a single pattern structure in which a first opening is formed at a center portion of the structure. The first signal pattern 321a is disposed in the first opening. An outline of the first opening and an outline of the first signal pattern 321a are spaced a predetermined distance. For example, a distance between the outline of the first opening and the outline of the first signal pattern 321a is potentially smaller than the distance between the first probe of the probe-tip member 130, to which the test signal is applied, and the second probe thereof, to which the ground signal is applied. As an example, the first ground pattern 321b is formed in a rectangular shape having the first opening at a center portion of the first ground pattern 321b.

Continuing this example, the second through electrodes 323b and 323c include two through electrodes. In this case, the second through electrodes 323b and 323c are disposed to be spaced apart from each other in the first horizontal direction Y in a state in which the first through electrode 323a is interposed therebetween, and are connected with portions of the first ground pattern 321b, which are located above and under the first through electrode connection part of the first signal pattern 321a. That is, the two second through electrodes 323b and 323c are disposed in series in the first horizontal direction Y together with the first through electrode 323a.

Since the second signal pattern 322a and the second ground pattern 322b, and the first signal pattern 321a and the first ground pattern 321b have a mirror-image symmetric structure having the same size with respect to the substrate 310, detailed description of the similar patterns is omitted.

The calibration kit 300 according to this example further includes one or more short patterns 330, one or more open patterns 340, and one or more load patterns 350 for performing each of the short calibration, the open calibration, and the load calibration of the probe system. For example, the short patterns 330, the open patterns 340, and the load patterns 350 are formed on one or more of a first surface and a second surface of the substrate 310.

In one example, each of the short patterns 330, the open patterns 340, and the load patterns 350 is formed on the first and second surfaces of the substrate 310, respectively.

In this example, the short patterns 330 include a first short pattern 331 formed on the first surface of the substrate 310, and a second short pattern 332 formed on the second surface of the substrate 310, having a mirror-image symmetric structure together with the first short pattern 331, and formed to be overlapped with the first short pattern 331. The first and second short patterns 331 and 332 are potentially electrically insulated, and potentially have a rectangular shape extending along the first horizontal direction Y. The first probe of the probe-tip member, to which the signal voltage is applied, and the second probe of the probe-tip member, to which the ground voltage is applied, are positioned so as to be simultaneously in contact with the first and second short patterns 331 and 332.

Also in this example, the open patterns 340 include a first open pattern 341 formed on the first surface of the substrate 310, and a second open pattern 342 formed on the second surface of the substrate 310. The second open pattern 342 has a mirror-image symmetric structure together with the first open pattern 341, and is formed to be overlapped with the first open pattern 341. Therefore, the first open pattern 341 is described, and description of the second open pattern 342 is omitted. The first open pattern 341 includes a third signal pattern 341a and a third ground pattern 341b spaced from the third signal pattern 341a in the first horizontal direction Y and insulated from the third signal pattern 341a.

Continuing this example, the load patterns 350 include a first load pattern 351 formed on the first surface of the substrate 310, and a second load pattern 352 formed on the second surface of the substrate 310. The second load pattern 352 has a mirror-image symmetric structure together with the first load pattern 351, and is formed to be overlapped with the first load pattern 351. Therefore, the first load pattern 351 is described, and description of the second load pattern 352 is omitted. The first load pattern 351 includes a fourth signal pattern 351a, a fourth ground pattern 351b, and a resistor 351c. The fourth ground pattern 351b is formed to be spaced from the fourth signal pattern 351a in the first horizontal direction Y, and the resistor 351c potentially has a preset resistance value.

Figure 9A:
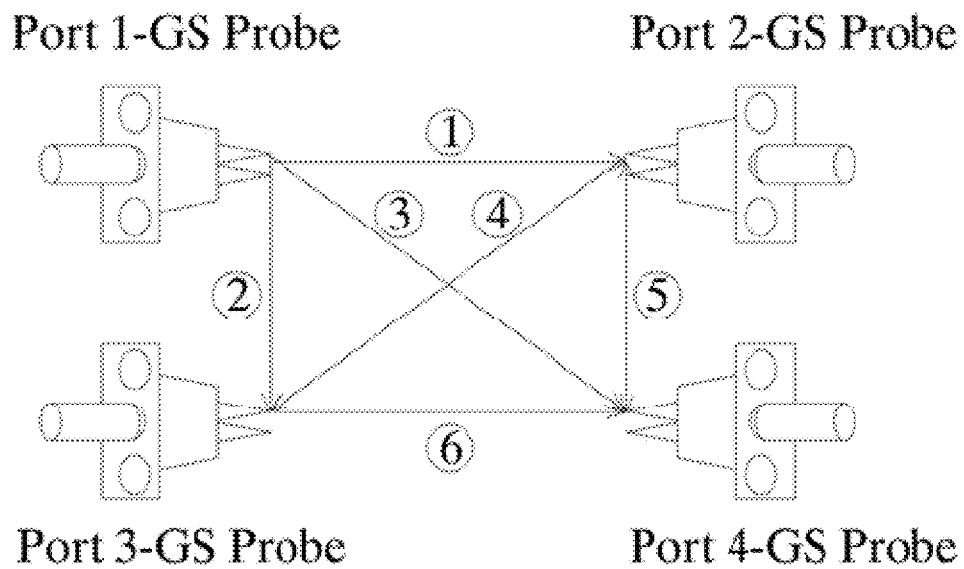
FIGS. 9A to 9C are views illustrating a calibration method of the probe system using a conventional calibration kit.
Figure 9B:
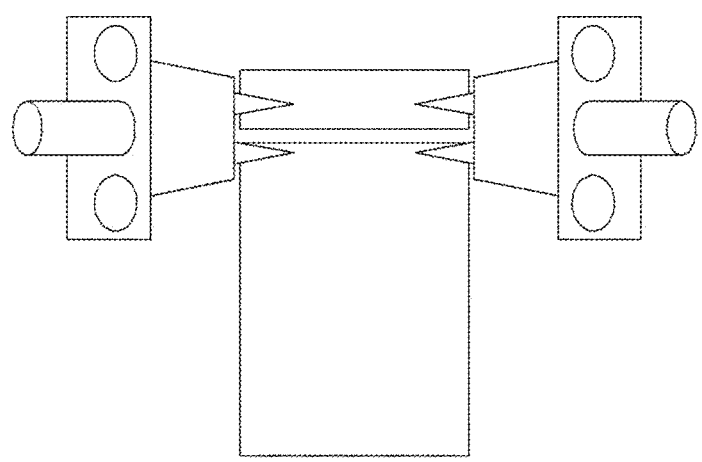
Figure 9C:
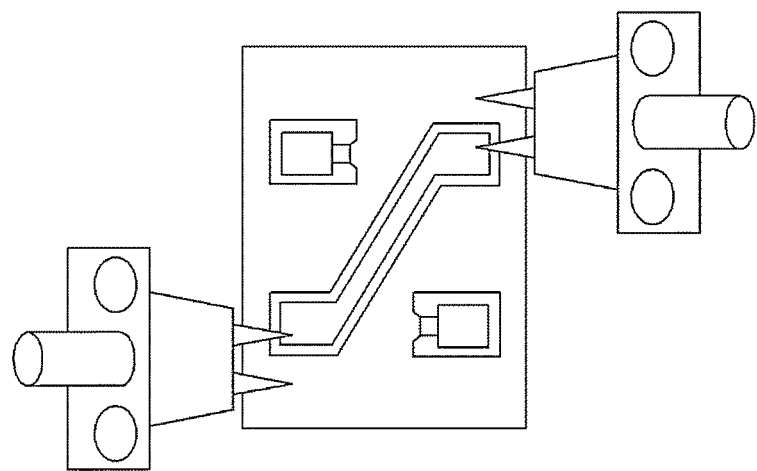

FIGS. 9A to 9C are views illustrating a calibration method of the probe system using a conventional calibration kit.

Referring to FIG. 9A, a conventional 4-port probe system as well as a 4-port probe system according to the embodiment of the present invention may include four probe-tip members port 1, port 2, port 3, and port 4, and each of the probe-tip members, in the example of FIG. 9A includes a first probe to which the test signal is applied, and a second probe to which the ground signal is applied. The probe-tip members are divided into a GS probe-tip member and an SG probe-tip member according to an arrangement order of the first probe and the second probe. As illustrated in FIG. 9A, the 4-port probe system according to the embodiment of the present invention and the conventional 4-port probe system include two GS probe-tip members port 1 and port 4 and two SG probe-tip members port 2 and port 3. In this example, the GS probe-tip members and the SG probe-tip members are alternately arranged to surround a center area in which the circuit board to be tested or the calibration kit is disposed.

For the thru calibration process among the open calibration, the short calibration, the load calibration, and the thru calibration of the probe system, as illustrated in FIG. 9A, several calibrations are encompassed. Each potential pair of ports should be calibrated. For example, the thru calibrations include a first calibration ① of FIG. 9A which is performed in a state in which the port 1 and port 2 of the four probe-tip members are simultaneously in contact with a single thru calibration pattern, a second calibration ② of FIG. 9A which is performed in a state in which the port 1 and port 3 are simultaneously in contact with the single thru calibration pattern, a third calibration ③ of FIG. 9A which is performed in a state in which the port 1 and port 4 are simultaneously in contact with the single thru calibration pattern, a fourth calibration ④ of FIG. 9A which is performed in a state in which the port 2 and port 3 are simultaneously in contact with the single thru calibration pattern, a fifth calibration ⑤ of FIG. 9A which is performed in a state in which the port 2 and port 4 are simultaneously in contact with the single thru calibration pattern, and a sixth calibration ⑥ of FIG. 9A which is performed in a state in which the port 3 and port 4 are simultaneously in contact with the single thru calibration pattern should be performed.

Then, referring to FIGS. 9B and 9C, when the thru calibration of the probe system is performed using the conventional calibration kit, a thru calibration pattern illustrated in FIG. 9B and a thru calibration pattern illustrated in FIG. 9C are part of the calibration process. Specifically, since the thru calibration pattern illustrated in FIG. 9B includes simultaneous contacts with only a combination of the SG probe-tip member and the GS probe-tip member or the GS probe-tip member and the SG probe-tip member, the third calibration (③ of FIG. 9A) and the fourth calibration (④ of FIG. 9A) of the first to sixth calibrations (① to ⑥ of FIG. 9A) are performed, but the third calibration (③ of FIG. 9A) and the fourth calibration (④ of FIG. 9A) are performed using the thru calibration pattern illustrated in FIG. 9C. Therefore, when the calibration of the probe system is performed using the conventional calibration kit, there is a problem that two calibration kits, i.e., a calibration kit including the pattern illustrated in FIG. 9B and a calibration kit including the pattern illustrated in FIG. 9C are required. Further, in the calibration using the pattern illustrated in FIG. 9B and the calibration using the pattern illustrated in FIG. 9C, when thru delay values are different from each other and measured values thereof are used, this situation leads to another problem that the calibration of the probe system is not accurately performed.

FIGS. 10A to 10D are views illustrating the thru calibration of the probe system using the calibration kit of FIGS. 8A and 8B.

Figure 10A:
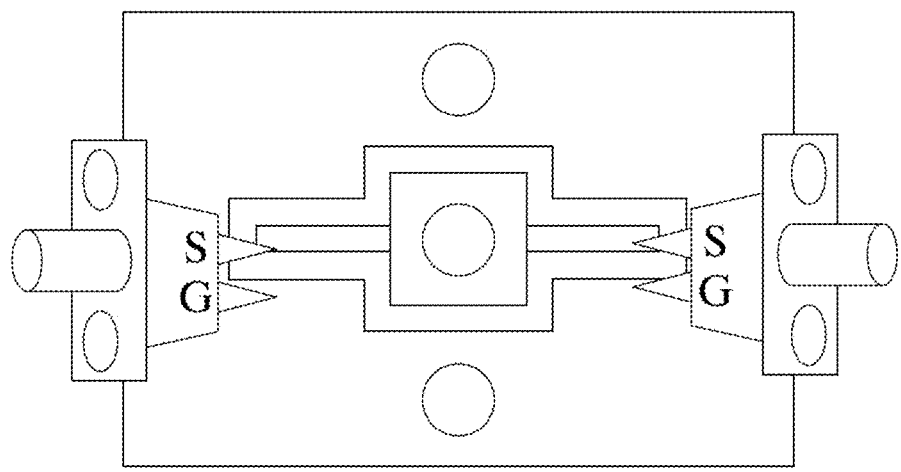
FIGS. 10A to 10D are views illustrating a calibration method of the probe system using the calibration kit of FIGS. 8A and 8B.
Figure 10B:
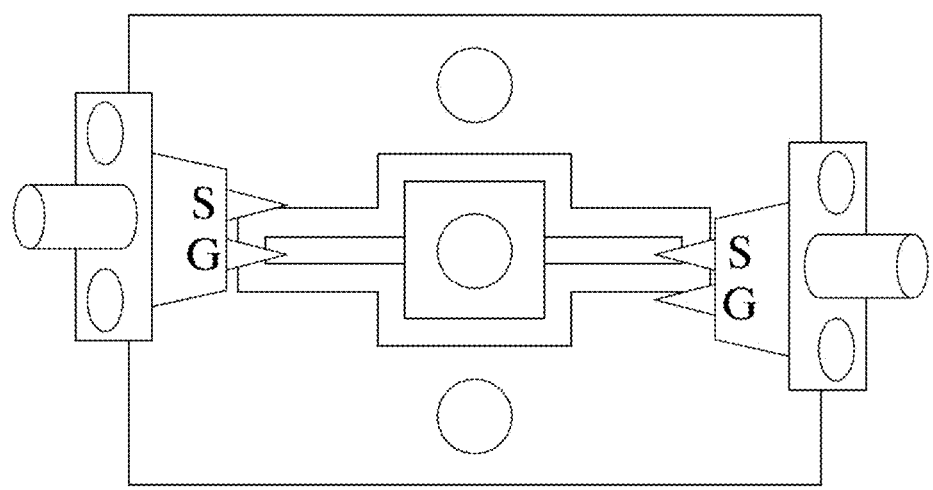

First, referring to FIGS. 10A and 10B, the first calibration ① of FIG. 9A, the second calibration ② of FIG. 9A the fifth calibration ⑤ of FIG. 9A, and the sixth calibration ⑥ of FIG. 9A of the above-mentioned thru calibrations, which are performed by a combination of the SG probe-tip member and the GS probe-tip member or a combination of the GS probe-tip member and the SG probe-tip member, are performed by putting the probes of the probe-tip members into contact with the signal pattern and the ground pattern, as illustrated in FIG. 10A. Also, the third calibration ③ of FIG. 9A and the fourth calibration ④ of FIG. 9A of the above-mentioned thru calibrations, which are performed by the combination of the SG probe-tip member and the SG probe-tip member or the combination of the GS probe-tip member and the GS probe-tip member, are performed by putting the probes of the probe-tip members into contact with the signal pattern and the ground pattern, as illustrated in FIG. 10B.

Figure 10C:
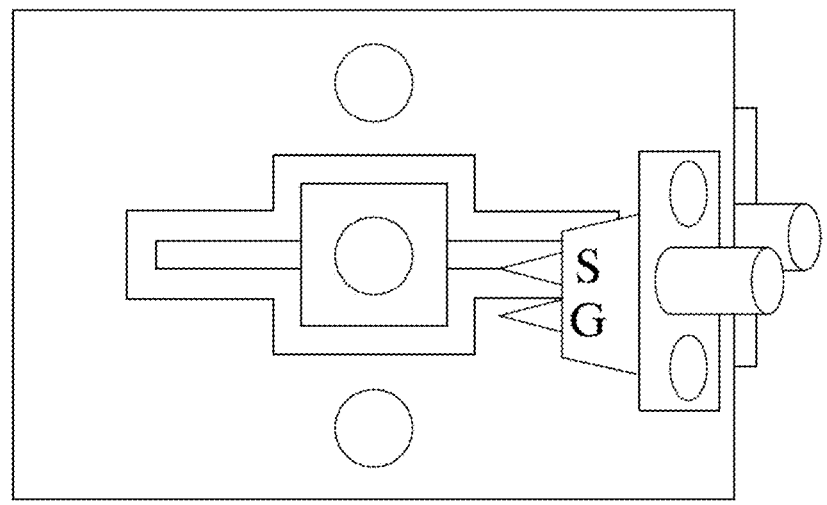
Figure 10D:
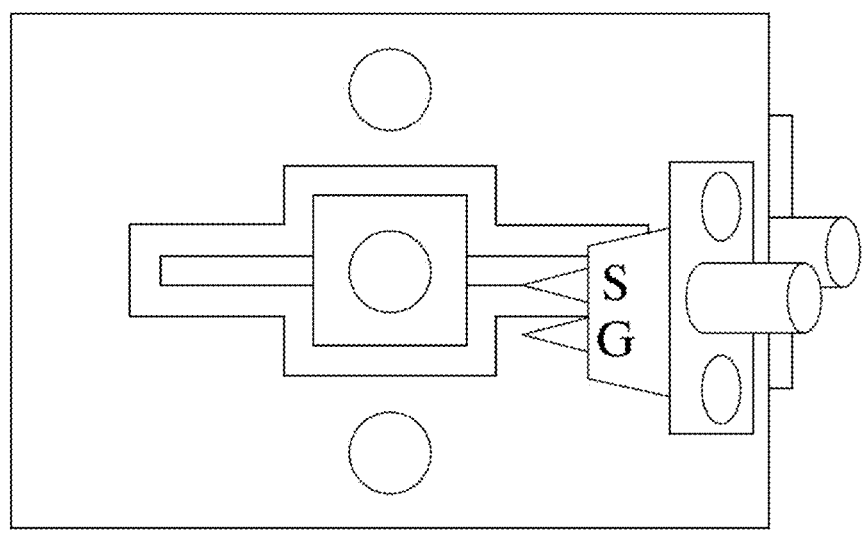

Meanwhile, referring to FIGS. 10C and 10D, when using the calibration kit according to the example, the thru calibration between the first conductive pattern 321 of FIGS. 8A-8B and the second conductive pattern 322 of FIGS. 8A-8B that are electrically connected through the through electrodes is also easily performed.

A first example is now discussed further.

Figure 11A:
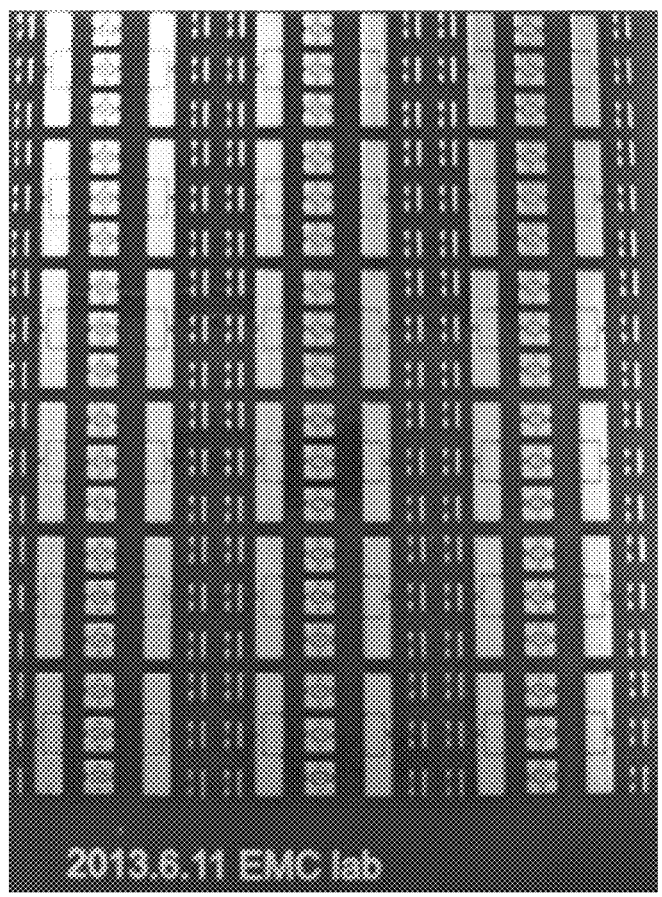
FIGS. 11A to 11C are views illustrating the calibration kit manufactured according to the example of FIGS. 7A and 7B.
Figure 11B:
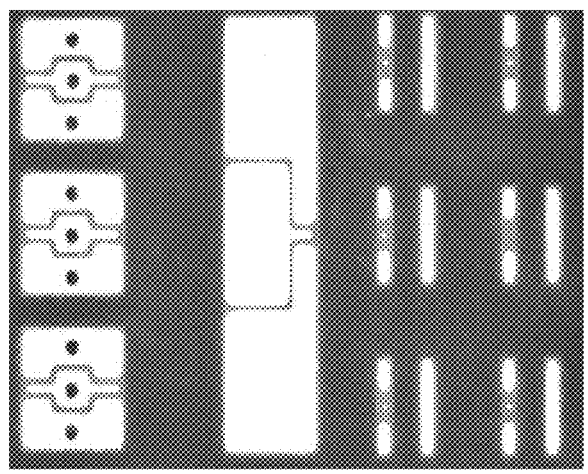
Figure 11C:
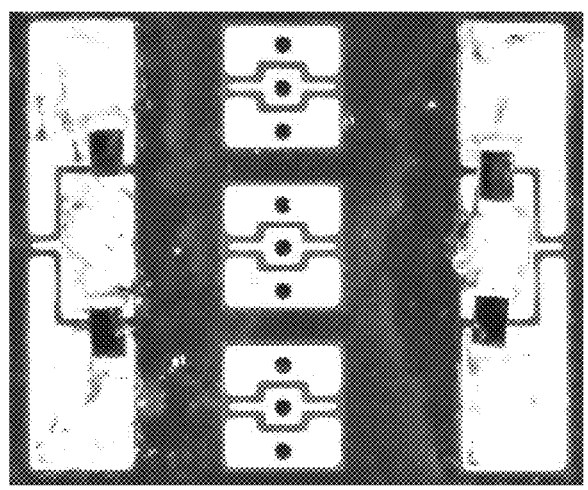

In this example, a calibration kit as illustrated in FIGS. 11A to 11C is manufactured using high frequency structural simulator (HFSS) software. As illustrated in FIG. 11A, in the manufactured calibration kit, the open pattern, the short pattern, the load pattern, the through pattern, the load pattern, the short pattern, and the open pattern are arranged, in turn, from a left side to a right side. In the example, the load pattern is formed by directly performing a soldering using a '1005(mm) chip resistor' made by Samsung Electro-mechanics, co., Ltd., and the load pattern is also formed to be greater than other patterns.

Through pattern characteristics of the manufactured calibration kit are measured after calibrating a network of a network analyzer using a 101-190C calibration kit manufactured by Cascade Microtech Inc. Results of such a measurement are indicated in FIGS. 13A and 13B.

Figure 13A:
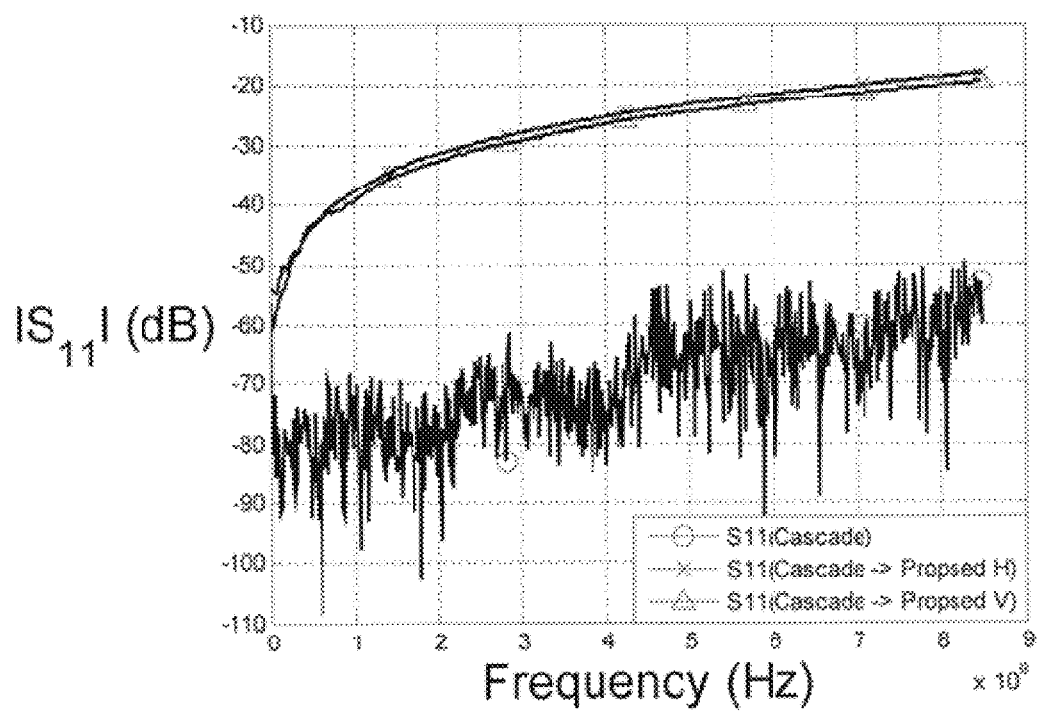
FIGS. 13A and 13B are graphs illustrating a result of measuring through pattern characteristics of the calibration kit of FIGS. 11A to 11C after calibrating a network analyzer using a 101-190C calibration kit manufactured by Cascade Microtech Inc.
Figure 13B:
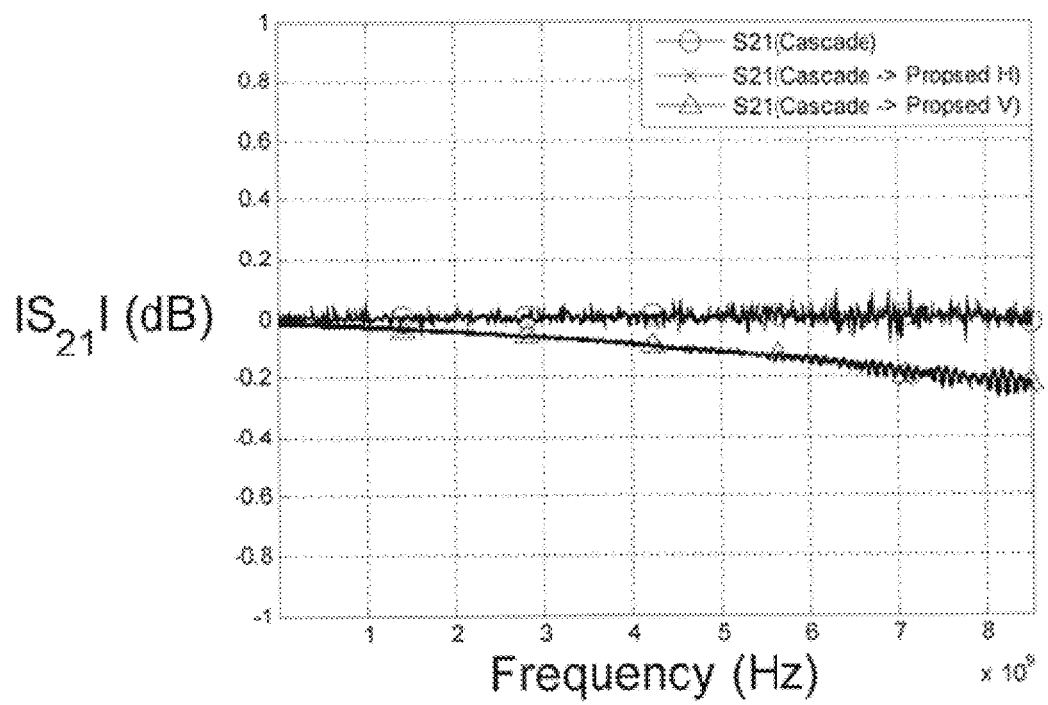

In FIGS. 13A and 13B, a line marked with an "X" symbol is the result of performing the horizontal test of the through pattern of the manufactured calibration kit, and a line marked with a "Δ" symbol is the result of performing the vertical test of the through pattern of the manufactured calibration kit, and a line marked with a "O" symbol is the result of measuring the calibration kit manufactured by Cascade Microtech Inc.

Further, referring to FIG. 13B, it is understood that a difference between S21 values is −0.2 dB.

A second example is now discussed further.

Figure 12A:
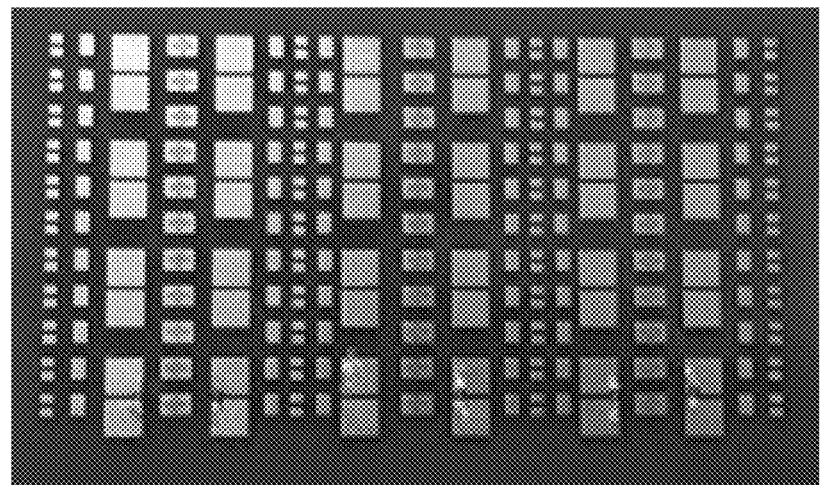
FIGS. 12A and 12B are views illustrating the calibration kit manufactured according to the example of FIGS. 8A and 8B.
Figure 12B:
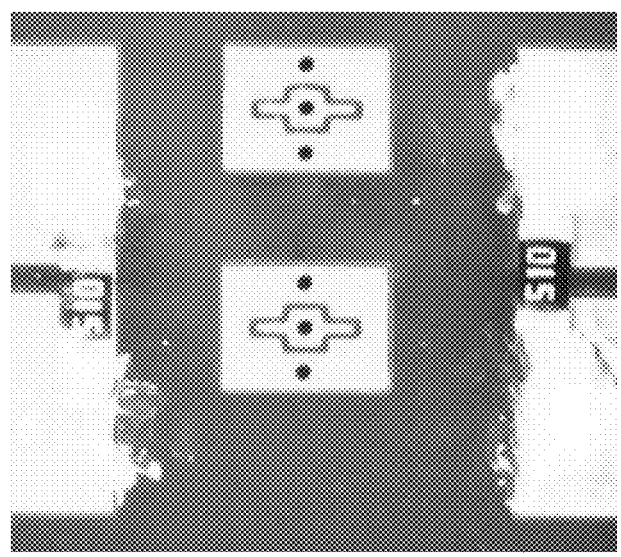

A calibration kit as illustrated in FIGS. 12A and 12B is manufactured using HFSS. As illustrated in FIG. 12A, in the manufactured calibration kit, the open pattern, the short pattern, the load pattern, the through pattern, the load pattern, the short pattern, and the open pattern are arranged, in turn, from a left side to a right side. The load pattern was formed by directly performing a soldering using a '1005 (mm) chip resistor' made by Samsung Electro-mechanics, co., Ltd., and also formed to be greater than other patterns.

Figure 14A:
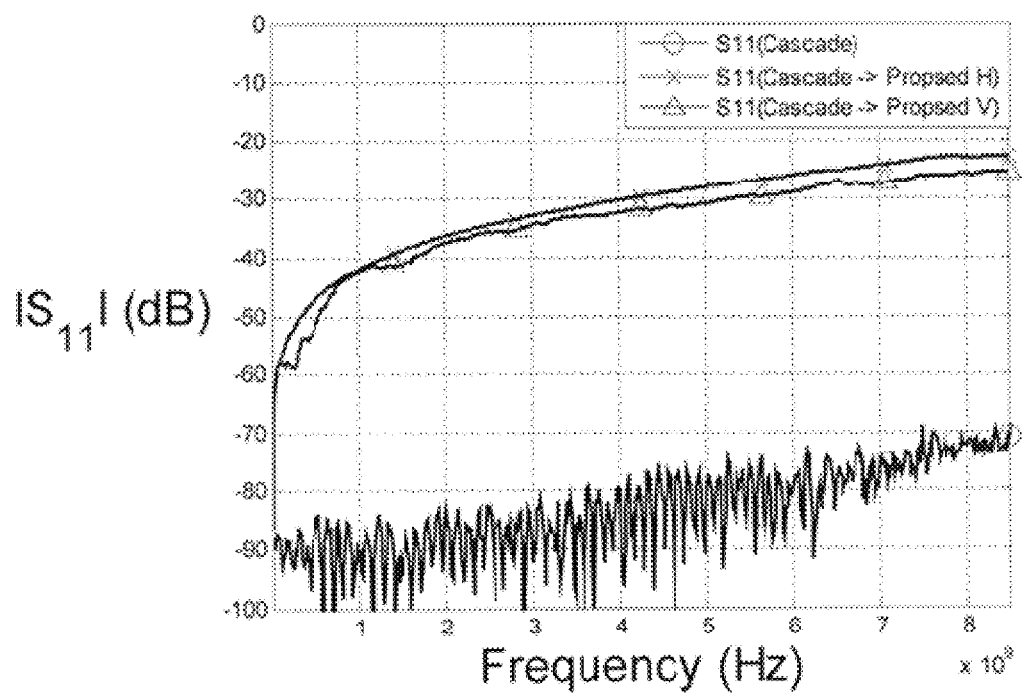
FIGS. 14A and 14B are graphs illustrating a result of measuring through pattern characteristics of the calibration kit of FIGS. 12A and 12B after calibrating the network analyzer using the calibration kit manufactured by Cascade Microtech Inc in FIG. 9C.
Figure 14B:
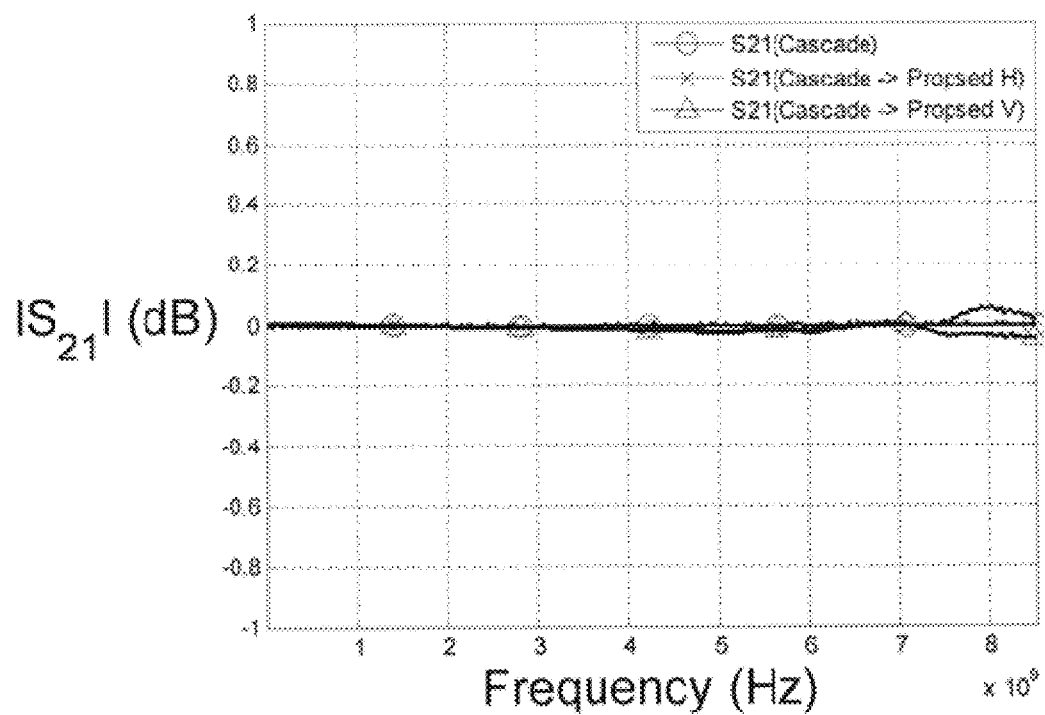

Through pattern characteristics of the manufactured calibration kit are measured after calibrating a network of a network analyzer using a calibration kit manufactured by Cascade Microtech Inc in FIG. 9C., and results thereof are indicated in FIGS. 14A and 14B.

In FIGS. 14A and 14B, a line marked with a "A" symbol is the result of performing the vertical test of the through pattern of the manufactured calibration kit, and a line marked with an "X" symbol is the result of performing the horizontal test of the through pattern of the manufactured calibration kit, and a line marked with an "O" symbol is the result of performing a test of the through pattern of the calibration kit manufactured by Cascade Microtech Inc.

Referring to FIG. 14A, a difference between S11 values at a low frequency and a high frequency is not large. However, it is to be understood that the difference between the S11 value of the calibration kit manufactured by Cascade Microtech Inc. and the S11 value of the manufactured calibration kit of the example is large.

Further, referring to FIG. 14B, it is to be understood that a difference between an S21 value of the calibration kit manufactured by Cascade Microtech Inc. and an S21 value of the manufactured calibration kit is less than ±0.1 dB.

According to the probe system of the present invention, the electromagnetic characteristics, the transfer characteristics, and the coupling characteristics of the vertical connection pins such as the through electrodes formed at the via-holes of the circuit board are easily measured. Specifically, in order to measure the electromagnetic characteristics of the vertical connector pin, the probe portions of the probe-tip member should be simultaneously in contact with both ends of the through electrode formed at the circuit board. In the present examples, the circuit board is grasped vertically to the upper surface of the base plate using the substrate grasping device of the support member, and the directions of the probes of the probe-tip member coupled to the two guide-arm members are easily adjusted using the rotational motion part of the guide-arm member so that the probes are simultaneously in contact with the both ends of the through electrode formed at the vertically grasped printed circuit board.

Further, according to the calibration kit of the present invention, the calibration of the vertical test is performed by putting the Signal-Ground (SG) probe and the Ground-Signal (GS) probe or the Ground-Signal-Ground (GSG) probe as the probe-tip member of the probe system into contact with the calibration kit in which the through pattern is formed, and thus the network analyzer is calibrated within a short period of time without using an additional subsidiary device, when calibrating the network analyzer for measuring the multi-port characteristics.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A calibration kit that is applied to a calibration of a probe system, comprising:
    a substrate; and
    a through pattern,
    wherein the through pattern comprises:
    a first conductive pattern formed at a first surface of the substrate and having a first signal pattern and one or more first ground patterns spaced from the first signal pattern;
    a second conductive pattern formed at a second surface of the substrate opposite to the first surface and having a second signal pattern having a mirror-image symmetric structure together with the first signal pattern and one or more second ground patterns having a mirror-image symmetric structure together with the first ground patterns; and
    a through electrode having a first through electrode configured to pass through the substrate and to electrically connect the first signal pattern with the second signal pattern and one or more second through electrodes configured to pass through the substrate and to electrically connect the first ground patterns with the corresponding second ground patterns.

2. The calibration kit of claim 1, wherein the first ground patterns are spaced from each other in a state in which the first signal pattern is interposed between the first ground patterns and the first ground patterns comprise two ground patterns insulated from each other, and
    the second ground patterns are spaced from each other in a state in which the second signal pattern is interposed between the second ground patterns and the second ground patterns comprise two ground patterns insulated from each other, and
    the second through electrode comprises a through electrode configured to electrically connect one of the first ground patterns with one of the second ground patterns, which overlaps with the one of the first ground patterns, and a through electrode configured to electrically connect the other one of the first ground patterns with the other one of the second ground patterns, which overlaps with the other one of the first ground patterns.

3. The calibration kit of claim 2, wherein the first signal pattern comprises a first through electrode connection part connected to one end of the first through electrode, and two first probe connection parts disposed to be symmetrical with respect to the first through electrode connection part, connected to both sides of the first through electrode connection part, and configured to extend in a first direction, and
    the two ground patterns of the first ground pattern are spaced from each other in a second direction vertical to the first direction, and
    a length of the first signal pattern in the first direction is the same as that of the first ground pattern in the first direction.

4. The calibration kit of claim 1, wherein the first ground pattern and the second ground pattern have a first opening and a second opening formed at center portions thereof, respectively, and
    the first signal pattern and the second signal pattern are disposed in the first opening and the second opening, respectively.

5. The calibration kit of claim 4, wherein an outline of the first opening and an outline of the first signal pattern are spaced a predetermined distance from each other.

6. The calibration kit of claim 4, wherein each of the first signal pattern and the second signal pattern comprises:
    a through electrode connection part connected with the first through electrode; and
    two first probe connection parts disposed to be symmetrical with respect to the through electrode connection part, connected with both sides of the through electrode connection part, and configured to extend in the same direction.

7. The calibration kit of claim 4, wherein the second through electrode comprises two electrodes configured to electrically connect the first ground pattern with the second ground pattern, and
    the first through electrode and the two second through electrodes are arranged in a row.

* * * * *